(12) United States Patent
Wu

(10) Patent No.: US 7,306,899 B2
(45) Date of Patent: Dec. 11, 2007

(54) METHOD FOR MANUFACTURING PHOTORESIST HAVING NANOPARTICLES

(75) Inventor: MeiLing Wu, Tu-Cheng (TW)

(73) Assignee: Innolux Display Corp., Miao-Li (TW)

( * ) Notice: Subject to any disclaimer, the term of this patent is extended or adjusted under 35 U.S.C. 154(b) by 0 days.

(21) Appl. No.: 11/492,283

(22) Filed: Jul. 24, 2006

(65) Prior Publication Data

US 2007/0020564 A1    Jan. 25, 2007

(30) Foreign Application Priority Data

Jul. 22, 2005    (CN) .................. 2005 1 0036146

(51) Int. Cl.
*G03C 5/00* (2006.01)
*G03C 1/76* (2006.01)
*G03C 1/492* (2006.01)
*G03C 1/494* (2006.01)

(52) U.S. Cl. .................. 430/311; 430/270.1; 430/325; 430/328; 430/331

(58) Field of Classification Search ................ 430/311, 430/328, 325, 331, 270.1
See application file for complete search history.

(56) References Cited

U.S. PATENT DOCUMENTS

| 6,613,499 B2 * | 9/2003 | Chang ..................... 430/325 |
| 6,716,897 B2 | 4/2004 | Okutsu et al. |
| 2002/0187438 A1 * | 12/2002 | Chang ..................... 430/326 |

* cited by examiner

*Primary Examiner*—Geraldina Visconti
(74) *Attorney, Agent, or Firm*—Wei Te Chung

(57) ABSTRACT

An exemplary method for manufacturing photoresist includes the steps of: adding a metal salt into an aqueous solution, whereby the aqueous solution contains metallic ions (211); adding a sulfide containing sulfur ions (231) into the aqueous solution; adding a polymerizable surfactant (220) into the aqueous solution thereby forming metallic ion reverse micelles (210) and sulfur ion reverse micelles (230); reacting the metallic ion reverse micelles and the sulfur ion reverse micelles to create monomeric sulfureted metal nanoparticle reverse micelles (240); aggregating the monomeric sulfureted metal nanoparticle reverse micelles to polymeric macromolecular nanoparticles; and doping the polymeric macromolecules nanoparticles into a base material in order to obtain the photoresist having sulfureted metal nanoparticles. A diameter of the nanoparticles is in the range from $1 \times 10^{-9}$ meters to $1 \times 10^{-7}$ meters.

14 Claims, 2 Drawing Sheets

US 7,306,899 B2

METHOD FOR MANUFACTURING PHOTORESIST HAVING NANOPARTICLES

FIELD OF THE INVENTION

The present invention relates to a method for manufacturing photoresist having nanoparticles, whereby the photoresist can be used, for example, as a color photoresist in a color filter of a product such as a liquid crystal display (LCD).

GENERAL BACKGROUND

Liquid crystal displays are commonly used as display devices for compact electronic apparatuses, because they are not only very thin but also provide good quality images with little power consumption.

A typical LCD device includes an LCD panel. The LCD panel includes two transparent substrates parallel to each other, and a liquid crystal layer disposed between the substrates. In order to enable the LCD device to display full-color images, a color filter is usually employed in the LCD device at one of the substrates. A typical color filter provides three primary colors: red, green, and blue (RGB). The color filter, the liquid crystal layer, and a switching element arranged on the substrate cooperate to provide the LCD device with full-color image display capability.

As shown in FIG. 3, a typical color filter 30 includes a substrate 300, a black matrix 310 disposed on the substrate 300, and a patterned photoresist layer 320 disposed in and around holes of the black matrix 310. A transparent overcoat layer 330 is arranged on and covers portions of the black matrix 310 and the photoresist layer 320. The substrate 300 functions as a carrier of the above-described elements. The photoresist layer 320 includes a multiplicity of pixel regions 321. Each pixel region 321 includes three sub-pixel regions: a red sub-pixel region 322, a green sub-pixel region 324, and a blue sub-pixel region 326, which are arranged in a predetermined pattern. The black matrix 310 is disposed in and around the sub-pixel regions 322, 324 and 326 of the pixel regions 321.

The photoresist layer 320 is generally made from organic components, such as a combination of polymer, surfactant, pigment, and monomer. However, the thermal resistance of the pigment is generally poor, which can result in poor color reproduction of the color filter 30.

To solve this problem, a plurality of nanoparticles can be doped into the photoresist material that is used for fabricating the photoresist layer 320. In general, there are two types of methods for manufacturing the nanoparticles: physical methods and chemical methods. Typical chemical methods include Chemical Vapor Deposition (CVD), precipitation, and the reverse micelle method. Diameters of the nanoparticles that are manufactured by conventional chemical methods are typically in the range from $5 \times 10^{-8}$ meters to $2 \times 10^{-7}$ meters. Light scattering often occurs when light beams pass through a color filter employing photoresist having these nanoparticles. This can result in reduced contrast and reduced light transmission of the color filter 30.

What is needed, therefore, is a method for manufacturing photoresist that can overcome the above-described deficiencies.

SUMMARY

An exemplary method for manufacturing photoresist includes the steps of: adding a metal salt into an aqueous solution, whereby the aqueous solution contains metallic ions; adding a sulfide containing sulfur ions into the aqueous solution; adding a polymerizable surfactant into the aqueous solution thereby forming metallic ion reverse micelles and sulfur ion reverse micelles; reacting the metallic ion reverse micelles and the sulfur ion reverse micelles to create monomeric sulfureted metal nanoparticle reverse micelles; monomeric sulfureted metal nanoparticle reverse micelles to polymeric macromolecular nanoparticles; and doping the polymeric macromolecules nanoparticles into a base material in order to obtain the photoresist having sulfureted metal nanoparticles.

A diameter of the nanoparticles is in the range from $1 \times 10^{-9}$ meters to $1 \times 10^{-7}$ meters.

Other advantages and novel features will become more apparent from the following detailed description when taken in conjunction with the accompanying drawings. In the drawings, all the views are schematic.

DETAILED DESCRIPTION OF PREFERRED EMBODIMENTS

Reference will now be made to the drawings to describe the preferred embodiments in detail.

Figure 1:
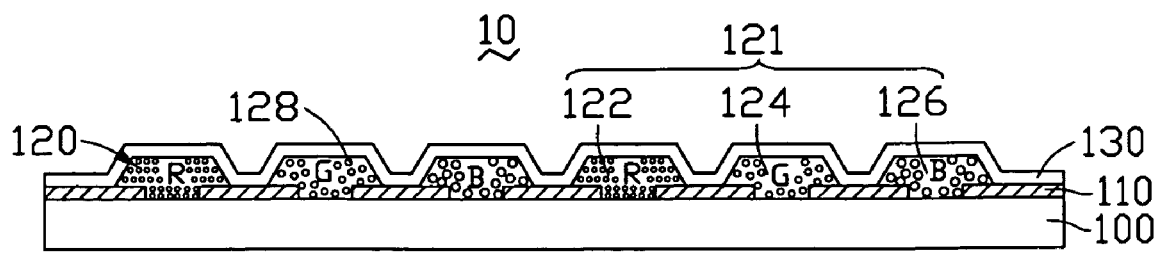
FIG. 1 is a side cross-sectional view of part of a color filter having photoresists doped with nanoparticles, each photoresist being manufactured according to a method for manufacturing photoresist with nanoparticles according to an exemplary embodiment of the present invention.

FIG. 1 is a schematic, side cross-sectional view of part of a color filter having photoresists doped with nanoparticles, each photoresist being manufactured according to a method for manufacturing photoresist with nanoparticles according to an exemplary embodiment of the present invention. The color filter 10 includes a substrate 100, a black matrix 110 disposed on the substrate 100, and a patterned photoresist layer 120 disposed in and around the black matrix 110. A transparent overcoat layer 130 is arranged on and covers portions of the black matrix 110 and the photoresist layer 120. The substrate 100 functions as a carrier of the above-described elements. The photoresist layer 120 includes a multiplicity of pixel regions 121. Each pixel region 121 includes three sub-pixel regions: a red sub-pixel region 122, a green sub-pixel region 124, and a blue sub-pixel region 126, which are arranged in a predetermined pattern. The black matrix 110 is disposed in and around the sub-pixel regions 122, 124 and 126 of the pixel regions 121, for preventing light rays from mixing among adjacent sub-pixel regions 122, 124 and 126.

Photoresists of each of the sub-pixel regions 122, 124, and 126 include a plurality of nanoparticles 128. A material, a shape, and a diameter of the nanoparticles 128 are selected according to the desired light transmission characteristics of the respective sub-pixel regions 122, 124, or 126. Preferably, diameters of the nanoparticles 128 are in the range from $1 \times 10^{-9}$ meters to $1 \times 10^{-7}$ meters. The shape of the nanoparticles 128 can be cylindrical, columnar, pyramidal, prismatic, spherical, ovoid, oval-shaped or elliptical in cross-section, etc.

Figure 2:
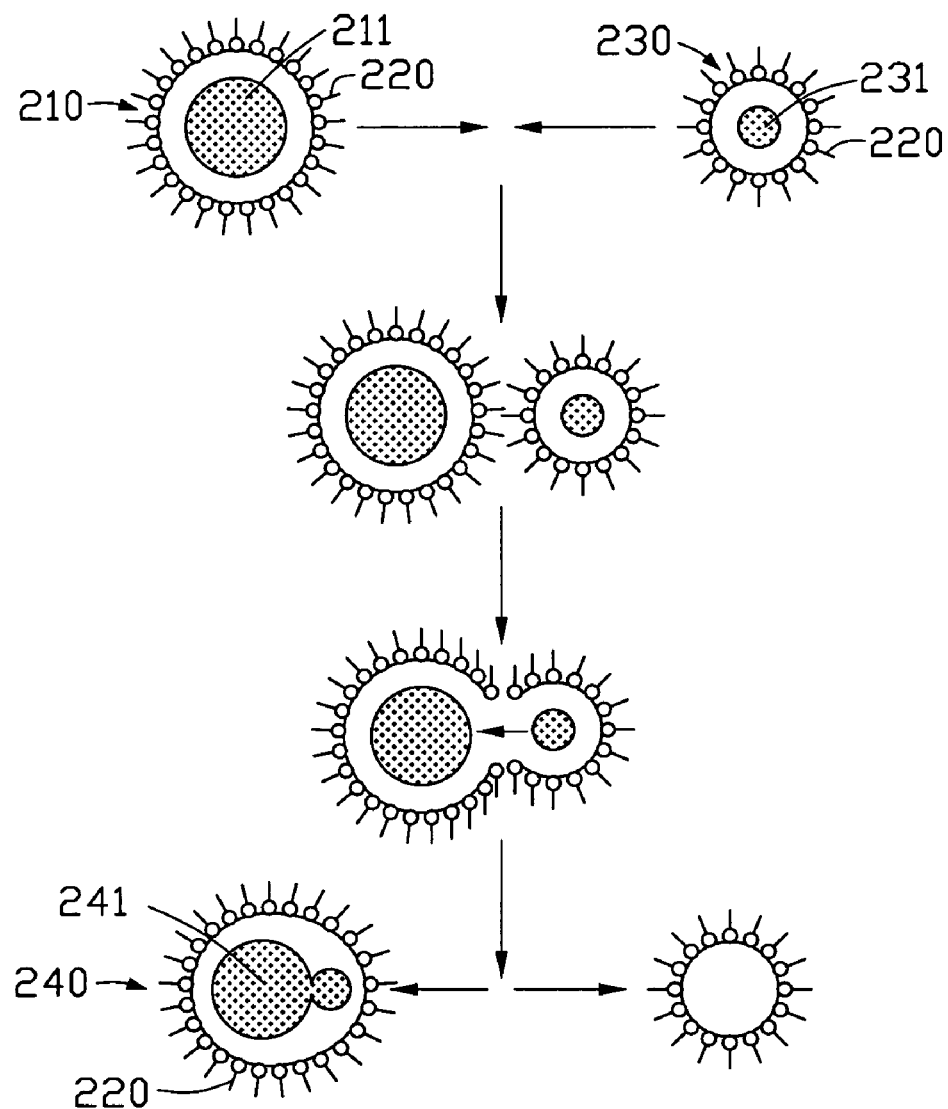
FIG. 2 is a flow diagram of in-situ reaction during a process of fabricating nanoparticles to be doped in a base material, in accordance with the exemplary embodiment of the present invention.
Figure 3:
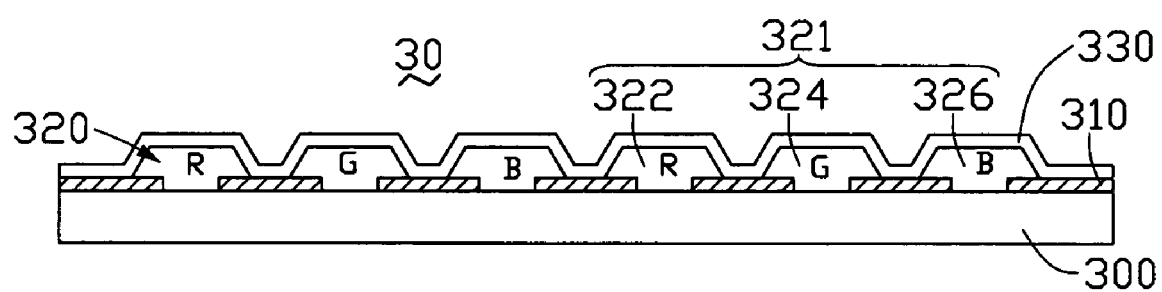
FIG. 3 is a side cross-sectional view of part of a conventional color filter.

The exemplary method for manufacturing photoresist with nanoparticles is as follows:

The initial stage of manufacturing the photoresist with nanoparticles is to provide nanoparticles. An exemplary process for manufacturing the nanoparticles includes the steps of: 1) adding a metal salt such as cadmium nitrate ($Cd(NO_3)_2$) into an aqueous solution, to form a cadmium nitrate aqueous solution ($Cd(NO_3)_2H_2O$) containing cadmium ions; 2) adding a sulfide such as sulfureted hydrogen gas or sulfureted sodium aqueous solution ($Na_2S\ 9H_2O$) into the cadmium nitrate ($Cd(NO_3)_2H_2O$) aqueous solution, so that the resulting aqueous solution contains sulfur ions; 3) adding polymerizable surfactant into the aqueous solution, the polymerizable surfactant including carbon-carbon double bonds; and 4) referring to FIG. 2, allowing the aqueous solution to induce in-situ reaction, wherein the cadmium ions 211 are surrounded by the polymerizable surfactant 220 to form reverse micelles 210, and the sulfur ions 231 are surrounded by the polymerizable surfactant 220 to form reverse micelles 230, and allowing the two kinds of reverse micelles 210 and 230 to induce in-situ reaction, wherein the reverse micelles 210 and 230 collide with each other to form reverse micelles 240, each of which comprises monomeric cadmium sulfide (CdS) nanoparticles 241 surrounded by the polymerizable surfactant 220.

In general, the CdS nanoparticles 241 of the reverse micelles 240 have a diameter in the range from $1\times10^{-9}$ meters to $1\times10^{-7}$ meters and an extremely small volume. The small volume makes the reverse micelles 240 hard to use. In the next step, the reverse micelles 240 are aggregated to polymeric macromolecular nanoparticles via optical aggregative action or thermo-aggregative action.

In the final step, the polymeric macromolecules are doped into a metal, ceramic, or resin base material as second phase accession to form a nanometer polymeric material. The nanometer polymeric material constitutes the photoresist with nanoparticles, which is used in the photoresist layer 120. That is, the nanoparticles in the photoresist layer 120 are CdS nanoparticles 241. In alternative embodiments, other kinds of sulfureted metal nanoparticles can be obtained (see below).

In general, when the diameter of a particle approaches the nanometer level ($1\times10^{-9}$ meters), many physical, chemical, and magnetic characteristics of the particle change. Sizes of the nanoparticles of each of the three kinds of reverse micelles are configurable according to an aqueous ratio of the aqueous solution, and a color of visible light rays that transmit through the photoresist layer 120 is controllable according to the sizes of the nanoparticles. For example, as the diameter of particles of CdS decreases, the color of corresponding transmission rays changes. When the diameter of the CdS particles is about $2\times10^{-7}$ meters, the color of the transmission rays is gold or orange. When the diameter of the CdS particles is about $1\times10^{-7}$ meters, the color of the transmission rays is green. When the diameter of the CdS particles is about $2.6\times10^{-8}$ meters, the color of the transmission rays is burgundy. With suitable materials and diameters, the absorption spectra of the various nanoparticles can be controlled, and desired colors such as RGB can be achieved.

In step 1) of the above-described exemplary method, the metal salt used is cadmium nitrate ($Cd(NO_3)_2$). In alternative embodiments, the metal of the metal salt may be selected from the group consisting of aluminum (Al), titanium (Ti), cadmium (Cd), chromium (Cr), nickel (Ni), silver (Ag), zinc (Zn), molybdenum (Mo), tantalum (Ta), tungsten (W), copper (Cu), gold (Au), platinum (Pt), and any suitable alloy thereof. Thus the metal of the corresponding sulfureted metal nanoparticles obtained may be selected from the group consisting of aluminum (Al), titanium (Ti), cadmium (Cd), chromium (Cr), nickel (Ni), silver (Ag), zinc (Zn), molybdenum (Mo), tantalum (Ta), tungsten (W), copper (Cu), gold (Au), platinum (Pt), and any suitable alloy thereof.

In summary, the color filter 10 uses photoresists having nanoparticles with a diameter in the range from $1\times10^{-9}$ meters to $1\times10^{-7}$ meters, and these nanoparticles have improved thermal resistance. In addition, the volume of the nanoparticles is very small, so light scattering is reduced. Accordingly, the contrast and the light transmission of the color filter 10 are improved.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A method for manufacturing photoresist, comprising the steps of:
   adding a metal salt into an aqueous solution, whereby the aqueous solution contains metallic ions;
   adding a sulfide containing sulfur ions into the aqueous solution;
   adding a polymerizable surfactant into the aqueous solution, thereby forming metallic ion reverse micelles and sulfur ion reverse micelles;
   reacting the metallic ion reverse micelles and the sulfur ion reverse micelles to create monomeric sulfureted metal nanoparticle reverse micelles;
   aggregating the monomeric sulfureted metal nanoparticle reverse micelles to polymeric macromolecular nanoparticles; and
   doping the polymeric macromolecular nanoparticles into a base material in order to obtain the photoresist comprising sulfureted metal nanoparticles.

2. The method for manufacturing photoresist as claimed in claim 1, wherein each of the metallic ion reverse micelles comprises one or more metallic ions surrounded by the polymerizable surfactant, and each of the sulfur ion reverse micelles comprises one or more sulfur ions surrounded by the polymerizable surfactant.

3. The method for manufacturing photoresist as claimed in claim 1, wherein each of the monomeric sulfureted metal nanoparticle reverse micelles comprises one or more monomeric sulfureted metal nanoparticles surrounded by the polymerizable surfactant.

4. The method for manufacturing photoresist as claimed in claim 1, wherein diameters of the nanoparticles are in the range from $1\times10^{-9}$ meters to $1\times10^{-7}$ meters.

5. The method for manufacturing photoresist as claimed in claim 1, wherein the metal salt comprises metal selected from the group consisting of Al, Ti, Cd, Cr, Ni, Ag, Zn, Mo, Ta, W, Cu, Au, Pt, and any alloy thereof.

6. The method for manufacturing photoresist as claimed in claim 1, wherein the metal salt is cadmium nitrate.

7. The method for manufacturing photoresist as claimed in claim 6, wherein the sulfide is one of sulfureted hydrogen gas and sulfureted sodium aqueous solution.

8. The method for manufacturing photoresist as claimed in claim 7, wherein the sulfureted metal nanoparticles comprise cadmium sulfide nanoparticles.

9. The method for manufacturing photoresist as claimed in claim 1, wherein sizes of the nanoparticles of each of the three kinds of reverse micelles are configurable according to an aqueous ratio of the aqueous solution.

10. The method for manufacturing photoresist as claimed in claim 9, wherein a color of transmission rays passing through the photoresist is controllable according to the sizes of the nanoparticles.

11. The method for manufacturing photoresist as claimed in claim 1, wherein the polymerizable surfactant comprises carbon-carbon double bonds.

12. The method for manufacturing photoresist as claimed in claim 1, wherein the monomeric sulfureted metal nanoparticle reverse micelles are aggregated to polymeric macromolecular nanoparticles by optical aggregative action.

13. The method for manufacturing photoresist as claimed in claim 1, wherein the monomeric sulfureted metal nanoparticle reverse micelles are aggregated to polymeric macromolecular nanoparticles by thermo-aggregative action.

14. A method for manufacturing photoresist, comprising the steps of:

adding a metal salt into an aqueous solution, whereby the aqueous solution contains metallic ions;

adding a metallic piece containing nonmetallic ions into the aqueous solution;

adding a polymerizable surfactant into the aqueous solution, thereby forming metallic ion reverse micelles and nonmetallic ion reverse micelles;

reacting the metallic ion reverse micelles and the nonmetallic ion reverse micelles to create monomeric chemically combined nonmetal and metal nanoparticle reverse micelles;

aggregating the monomeric chemically combined nonmetal and metal nanoparticle reverse micelles to polymeric macromolecular nanoparticles; and doping the polymeric macromolecular nanoparticles into a base material in order to obtain the photoresist comprising chemically combined nonmetal and metal nanoparticles.

\* \* \* \* \*